United States Patent
Lee et al.

(10) Patent No.: US 7,422,943 B2
(45) Date of Patent: Sep. 9, 2008

(54) SEMICONDUCTOR DEVICE CAPACITORS WITH OXIDE-NITRIDE LAYERS AND METHODS OF FABRICATING SUCH CAPACITORS

(75) Inventors: Jong-cheol Lee, Seoul (KR); Young-sun Kim, Gyeonggi-do (KR); Jung-hee Chung, Gyeonggi-do (KR); Jae-hyoung Choi, Gyeonggi-do (KR); Se-hoon Oh, Gyeonggi-do (KR); Hong-bum Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 11/386,660

(22) Filed: Mar. 22, 2006

(65) Prior Publication Data

US 2007/0040203 A1    Feb. 22, 2007

(30) Foreign Application Priority Data

Aug. 16, 2005    (KR) .................. 10-2005-0074914

(51) Int. Cl.
*H01L 21/8242* (2006.01)

(52) U.S. Cl. .................. 438/253; 438/240; 438/396; 257/E21.17; 257/E21.32; 257/E21.311; 257/E21.135; 257/E21.253; 257/E21.646; 257/E21.647

(58) Field of Classification Search .................. 438/253, 438/238, 243, 240, 381, 386, 396, 311, 513, 438/680, 663, 752, 933, 954
See application file for complete search history.

(56) References Cited

U.S. PATENT DOCUMENTS

| | | | | |
|---|---|---|---|---|
| 4,510,516 A | * | 4/1985 | Bartelink | 257/296 |
| 5,998,824 A | * | 12/1999 | Lee | 257/309 |
| 6,080,623 A | * | 6/2000 | Ono | 438/254 |
| 6,677,205 B2 | * | 1/2004 | Beintner | 438/270 |
| 6,753,618 B2 | | 6/2004 | Basceri et al. | |
| 6,987,042 B2 | * | 1/2006 | Beintner et al. | 438/243 |

FOREIGN PATENT DOCUMENTS

| KR | 1020040057535 A | 7/2004 |
|---|---|---|
| KR | 1020050005726 A | 1/2005 |

* cited by examiner

*Primary Examiner*—David Nhu
(74) *Attorney, Agent, or Firm*—Myers Bigel Sibley & Sajovec

(57) ABSTRACT

Capacitors having upper electrodes that include a lower electrode, a dielectric layer and an upper electrode that includes a conductive metal nitride layer and a doped polysilicon germanium layer are provided. At least part of the conductive metal nitride layer is oxidized and/or at least part of the dielectric layer is nitridized.

21 Claims, 7 Drawing Sheets

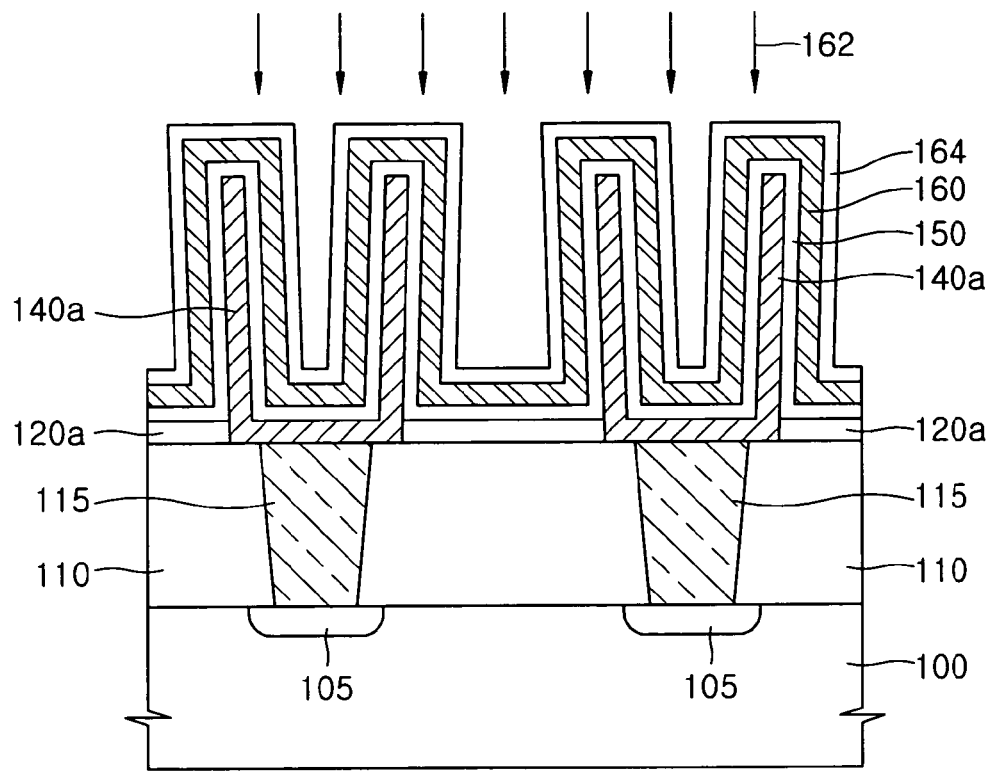
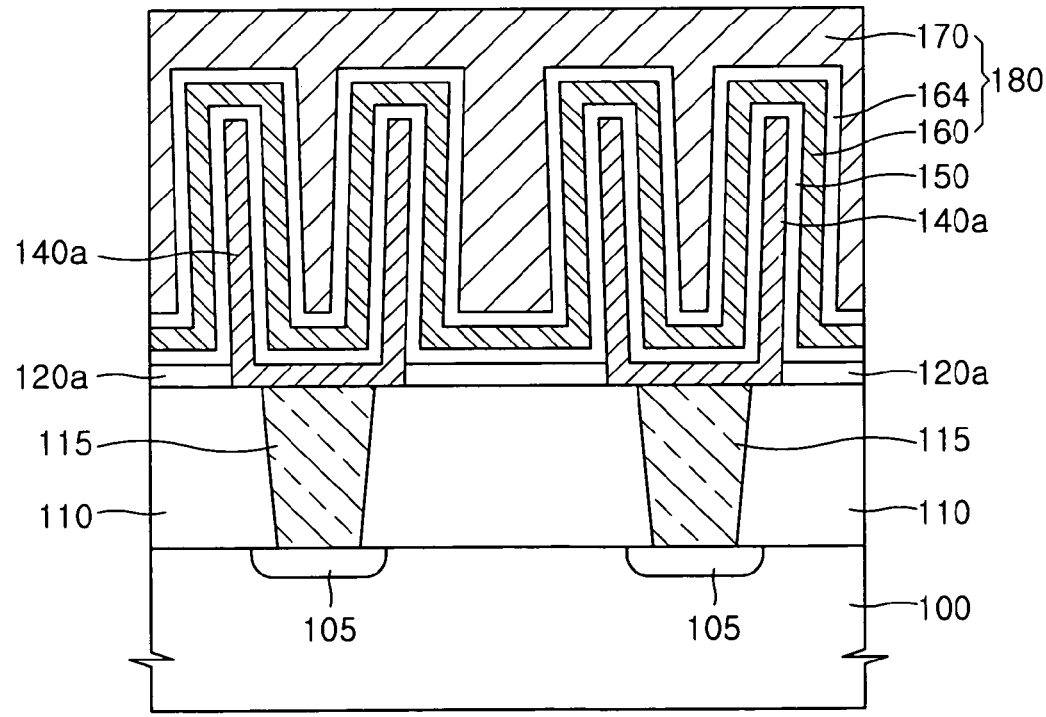

SEMICONDUCTOR DEVICE CAPACITORS WITH OXIDE-NITRIDE LAYERS AND METHODS OF FABRICATING SUCH CAPACITORS

CROSS-REFERENCE TO RELATED PATENT APPLICATION

This application claims priority under 35 U.S.C. § 119 from Korean Patent Application No. 10-2005-0074914, filed on Aug. 16, 2005 in the Korean Intellectual Property Office, the disclosure of which is hereby incorporated by reference herein as if set forth in its entirety.

FIELD OF THE INVENTION

The present invention relates to semiconductor devices and, more particularly, to semiconductor device capacitors and methods of fabricating the same.

BACKGROUND OF THE INVENTION

As semiconductor devices continue to become more highly integrated, the cell size of semiconductor devices such as dynamic random access memory (DRAM) devices continues to be reduced. As a result, the effective area of the lower electrode of the cell capacitor in such devices also becomes reduced. Typically, a certain level of cell capacitance is required to ensure stable operation of the device. To secure sufficient cell capacitance in a small area, the capacitor dielectric layer may be formed of a material such as, for example, $Al_2O_3$, $HfO_2$, $Ta_2O_5$, and/or $TiO_2$ that has a dielectric constant that is several times to a hundred times or more higher than the dielectric constant of a conventional oxide layer/nitride layer/oxide layer (ONO) capacitor dielectric layer.

Doped polysilicon layers have conventionally been used to form the electrodes of many semiconductor capacitors. Doped polysilicon, however, may react with the materials that are used to form to a high dielectric constant dielectric layer, and such reactions may deteriorate the electrical characteristic of the capacitor. As such, various alternative electrode materials have been investigated for use in capacitors having high dielectric constant dielectric layers. One example of such an alternative electrode material is a stacked layer consisting of (1) a metal, a conductive oxide of a metal, or a conductive nitride of a metal layer and (2) a doped polysilicon layer. The metal layer, the conductive metal oxide layer or the conductive metal nitride layer may all exhibit a small reactivity with the high dielectric layer. The doped polysilicon layer may be formed by depositing polysilicon via a low pressure chemical vapor deposition (LPCVD) process performed at, for example, about 530° C., and then performing a thermal treatment at, for example, a temperature of greater than about 600° C. for 30 minutes in an $N_2$ atmosphere. However, the leakage current characteristic of the device may deteriorate as a result of the high temperature thermal treatment.

Another alternative electrode material is a stacked layer consisting of a metal layer and a doped polysilicon germanium layer. The doped polysilicon germanium layer can be formed by a low temperature process. However, the stacked metal layer and doped polysilicon germanium layer electrode may exhibit increased leakage currents due to diffusion of the dopants in the polysilicon germanium layer into lower layers of the capacitor.

SUMMARY

Pursuant to embodiments of the present invention, capacitors having relatively small leakage currents are provided that may be used, for example, in highly integrated DRAM devices.

According to some embodiments of the present invention, semiconductor device capacitors are provided that include a lower electrode on a semiconductor substrate, a dielectric layer on the lower electrode and an upper electrode on the dielectric layer. The upper electrode includes a conductive metal nitride layer, at least part of which is oxidized, and a doped polysilicon germanium layer. The conductive metal nitride layer of the upper electrode may comprise TiN, and at least part of an upper surface of the conductive metal nitride layer may be oxidized to form TiON. $N_2$ may be trapped in interstitial sites within the TiON, or nitrogen may form N—O bonds in the TiON.

According to further embodiments of the present invention, semiconductor device capacitors are provided that include a lower electrode on a semiconductor substrate, an oxide dielectric layer on the lower electrode, at least part of which is nitridized, and an upper electrode on the dielectric layer. The upper electrode includes a conductive metal nitride layer and a doped polysilicon germanium layer. The dielectric layer may be a $HfO_2$ layer, at least part of an upper surface thereof may be nitridized to form a HfON layer, and $N_2$ may be trapped in interstitial sites within the HfON layer, or nitrogen may form N—O bonds in the HfON.

In the semiconductor device capacitors according to embodiments of the present invention, the lower electrode may be a doped polysilicon layer, a metal layer, a conductive metal nitride layer or a conductive metal oxide layer. The dielectric layer may comprise a $HfO_2$ layer, an $Al_2O_3$ layer, a $ZrO_2$ layer, a $Ta_2O_5$ layer, a $TiO_2$ layer, a $SrTiO_3$ layer, a $(Ba, Sr)TiO_3$ layer or a combination thereof. The doped polysilicon germanium layer may be doped with boron. The conductive metal nitride layer of the upper electrode may comprise TiN, WN, TaN or a combination thereof.

Pursuant to further embodiments of the present invention, methods of fabricating capacitors are provided in which a capacitor lower electrode is formed on a semiconductor substrate, and then a dielectric layer is formed on the lower electrode. After a conductive metal nitride layer is formed on the dielectric layer, at least part of the conductive metal nitride layer is oxidized. A doped polysilicon germanium layer is formed on the oxidized conductive metal nitride layer so as to form an upper electrode that includes the conductive metal nitride layer, at least part of which is oxidized, and the doped polysilicon germanium layer.

The conductive metal nitride layer of the upper electrode may be formed of TiN, at least part of an upper surface of the conductive metal nitride layer may be oxidized to form TiON, and $N_2$ may be trapped in interstitial sites within the TiON, or nitrogen may form N—O bonds in the TiON.

The operation of oxidizing at least part of the conductive metal nitride layer may be performed by rapid thermal oxidation (RTO) or a plasma oxidation.

According to further embodiments of the present invention, methods of fabricating capacitors are provided in which a capacitor lower electrode is formed on a semiconductor substrate, and an oxide dielectric layer is formed on the lower electrode. Then at least part of the dielectric layer is nitridized. Next, a conductive metal nitride layer and a doped polysilicon germanium layer are sequentially stacked on the at least partially nitridized dielectric layer to form an upper electrode.

The dielectric layer may be a $HfO_2$ layer, at least part of an upper surface thereof may be nitridized to form a HfON layer, and $N_2$ may be trapped in interstitial sites within the HfON, or nitrogen may form N—O bonds in the HfON layer. The operation of nitridizing at least part of the dielectric layer may be performed using a plasma nitridation.

Pursuant to still further embodiments of the present invention, methods of fabricating capacitors are provided in which a lower electrode is formed on a semiconductor substrate. A dielectric layer is formed on the lower electrode. An oxide-nitride layer is formed on the dielectric layer. An upper electrode that comprises a doped semiconductor layer is formed on the dielectric layer and on the oxide-nitride layer. The doped semiconductor layer may comprise a polysilicon germanium layer. The upper electrode may further include a conductive metal nitride layer. The oxide-nitride layer may be formed on the dielectric layer by oxidizing at least an upper surface of the conductive metal nitride layer. The oxide-nitride layer may also be formed by nitridizing at least an upper surface of the dielectric layer, where the dielectric layer is an oxide dielectric layer.

BRIEF DESCRIPTION OF THE DRAWINGS

The above and other features and advantages of the present invention will become more apparent by describing in detail embodiments thereof with reference to the attached drawings in which:

FIGS. 1 through 8 are cross-sectional diagrams illustrating semiconductor capacitors and methods of fabricating such capacitors according to first embodiments of the present invention;

DETAILED DESCRIPTION

Figure 1:
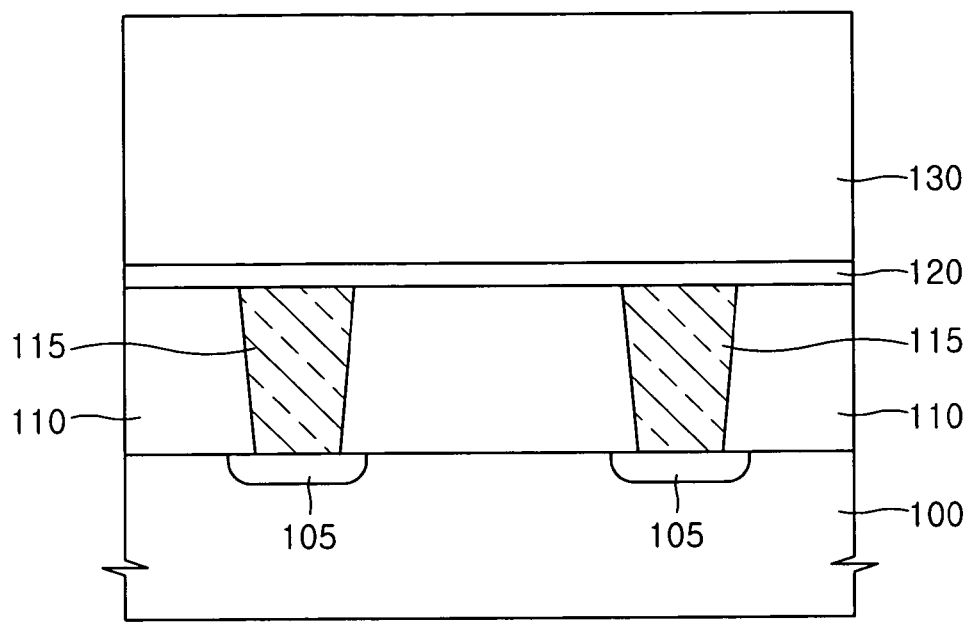

Embodiments of the present invention will now be described more fully hereinafter with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements may be exaggerated for clarity. Identical reference numerals have been used, where possible, to designate identical elements that are common to the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIGS. 1 through 8 are cross-sectional diagrams illustrating capacitors and methods of fabricating such capacitors according to first embodiments of the present invention.

First, the structure of a capacitor according to the first embodiments of the present invention will be described with reference to FIG. 8. As shown in FIG. 8, the capacitors according to the first embodiments of the present invention include: a capacitor lower electrode 140a that is formed on a semiconductor substrate 100, a dielectric layer 150 that is formed on the lower electrode 140a, and an upper electrode 180 that is formed on the dielectric layer 150. The upper electrode 180 comprises a conductive metal nitride layer 160, a conductive metal oxide nitride layer 164 formed by oxidizing part of the conductive metal nitride layer 160, and a doped polysilicon germanium layer 170.

The conductive metal nitride layer 160 may be formed of TiN. The conductive metal oxide nitride layer 164 may be formed of TiON. The conductive metal oxide nitride layer 164 may be formed by oxidizing at least part of an upper surface of the conductive metal nitride layer 160. During oxidation of the upper surface of the conductive metal nitride layer, $N_2$ may be trapped in interstitial sites within the TiON, and/or nitrogen may form N—O bonds within the TiON. The conductive metal oxide nitride layer 164 can reduce, minimize and/or prevent a dopant (for example, boron) of the doped polysilicon germanium layer 170 from penetrating into a lower layer of the capacitor by filling potential dopant sites in advance with nitrogen atoms. As a result, the capacitors according to the first embodiments of the present invention may avoid increases and/or reduce leakage currents, deterioration in data retention, and/or problems in a refresh characteristic that may be exhibited in other capacitors used in highly integrated semiconductor devices.

Next, a method of fabricating the capacitors of FIG. 8 will be described with reference to FIGS. 1-7. First, a capacitor lower electrode is formed on a semiconductor substrate such as a silicon substrate. It will be understood that the term "semiconductor substrate" encompasses both conventional semiconductor substrates as well as semiconductor substrates that are grown or formed on an insulator or other substrate using, for example, silicon-on-insulator (SOI) growth techniques. To increase the effective area of the lower electrode, the lower electrode may be formed as a three-dimensional structure (e.g., a box structure, one cylinder stack (OCS) structure, a stack structure or a trench structure). Though the OCS structure is shown in FIGS. 1-8, it will be appreciated that the various embodiments of the present invention described herein can be implemented with any of the other known capacitor structures.

Referring to FIG. 1, after a lower insulation layer 110 is formed on the semiconductor substrate 100, a contact plug 115 is formed that passes through the lower insulation layer 110 to make electrical contact with an impurity region 105 of the semiconductor substrate 100. An etch-stop layer 120 made, for example, of silicon nitride is then formed on the contact plug 115 and the lower insulation layer 110. Then, a mold oxide layer 130 is formed on the etch-stop layer 120. The mold oxide layer 130 may comprise, for example, boron phosphorus silicate glass (BPSG), phosphorus silicate glass (PSG), plasma enhanced (PE)-tetra ethyl ortho silicate (TEOS) and/or a high density plasma (HDP)-oxide.

Figure 2:
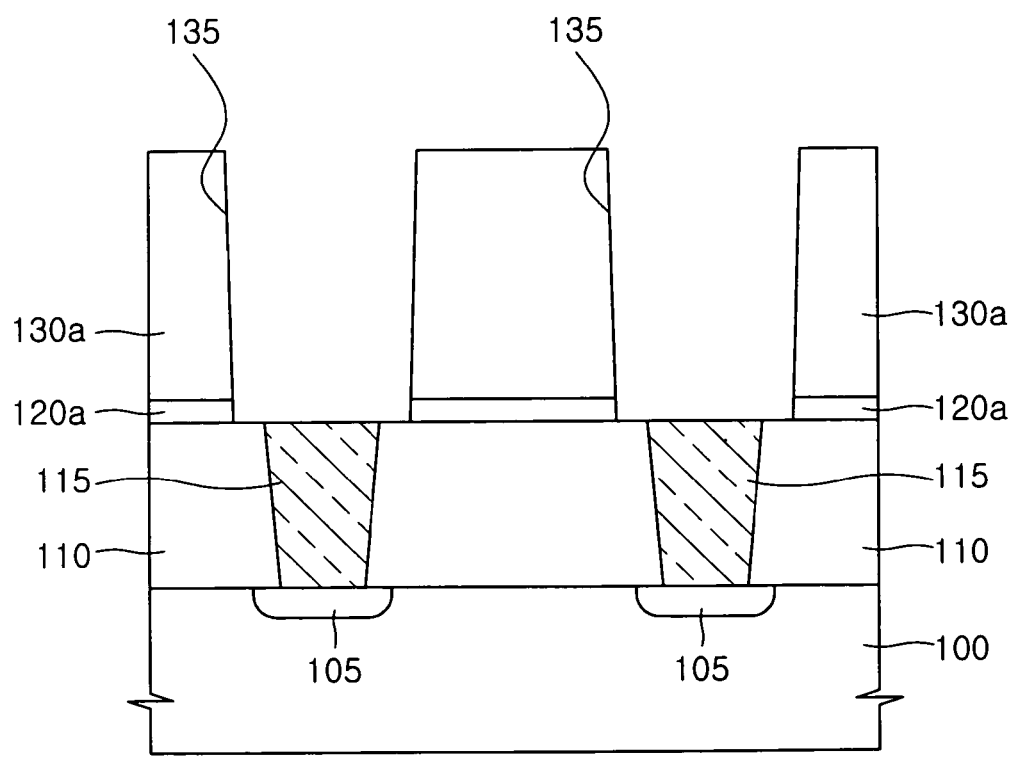

Next, referring to FIG. 2, the mold oxide layer 130 is etched until the upper surface of the etch-stop layer 120 is exposed, to form a mold oxide layer pattern 130a. During this etch process, the etch-stop layer 120 protects the lower insulation layer 110. Then, a second etching process may be performed to remove the exposed portions of the etch-stop layer 120, thereby forming holes 135 that expose the contact plugs 115 and the upper surface of the lower insulation layer 110 adjacent the contact plugs 115. An etch-stop layer pattern 120a remains at the lower portion of the mold oxide layer pattern 130a.

Figure 3:
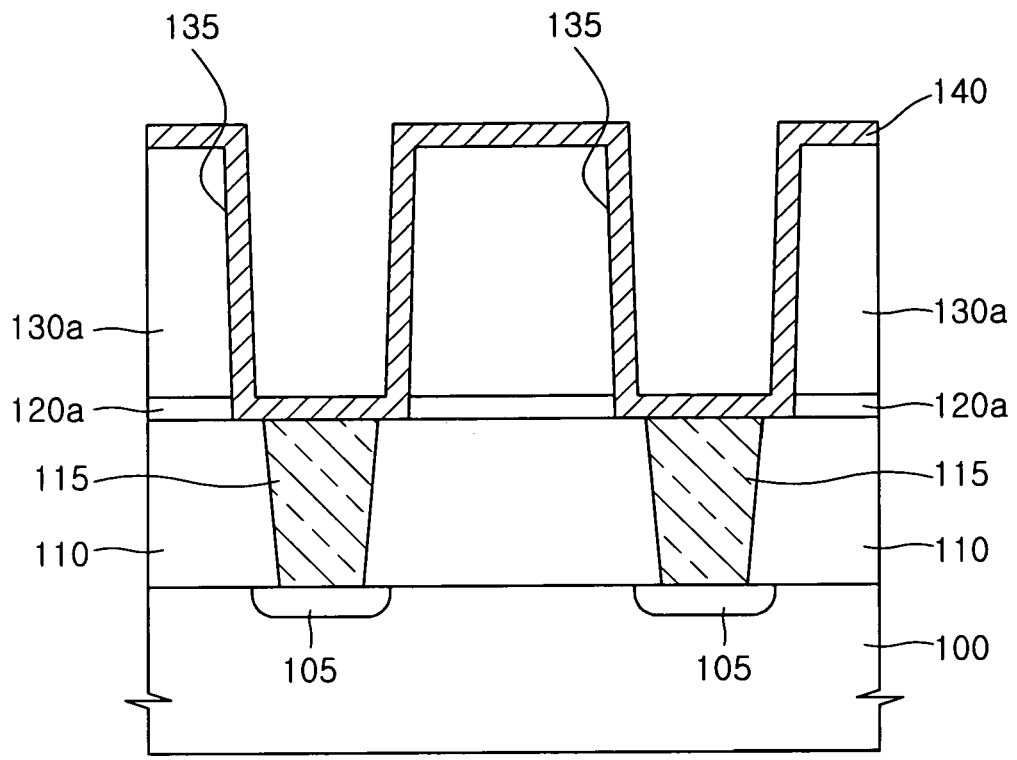

As shown in FIG. 3, a lower electrode layer 140 is formed to partially fill the holes 135. The lower electrode layer 140 may be formed of a doped polysilicon layer, a metal layer, a conductive metal nitride, and/or a conductive metal oxide layer. By way of example, the lower electrode layer 140 may comprise a doped polysilicon layer that is formed by depositing polysilicon using a low pressure chemical vapor deposition (CVD) or atomic layer deposition (ALD) technique, and then performing $PH_3$-doping thereon so as to secure specific resistance, so that n-type doped polysilicon is formed.

Figure 4:
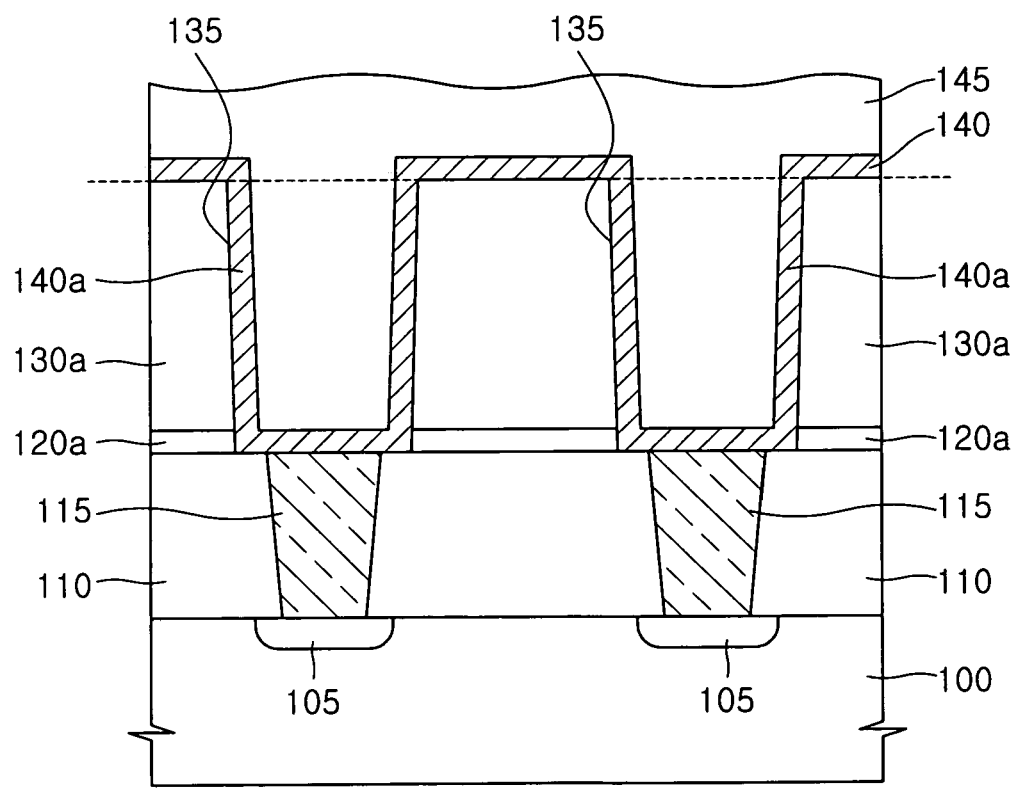

As shown in FIG. 4, next, a capping layer 145 (e.g., undoped silicate glass (USG)) that may have a strong gap-fill characteristic is deposited on the lower electrode layer 140 to fill the inside of the hole 135. Next, the capping layer 145 and portions of the lower electrode layer 140 (e.g., the portion above a dotted line in FIG. 4) may be removed to expose an upper surface of the mold oxide layer pattern 130a using, for example, an etch-back or chemical mechanical polishing (CMP) to form cylinder type-capacitor lower electrodes 140a.

Figure 5:
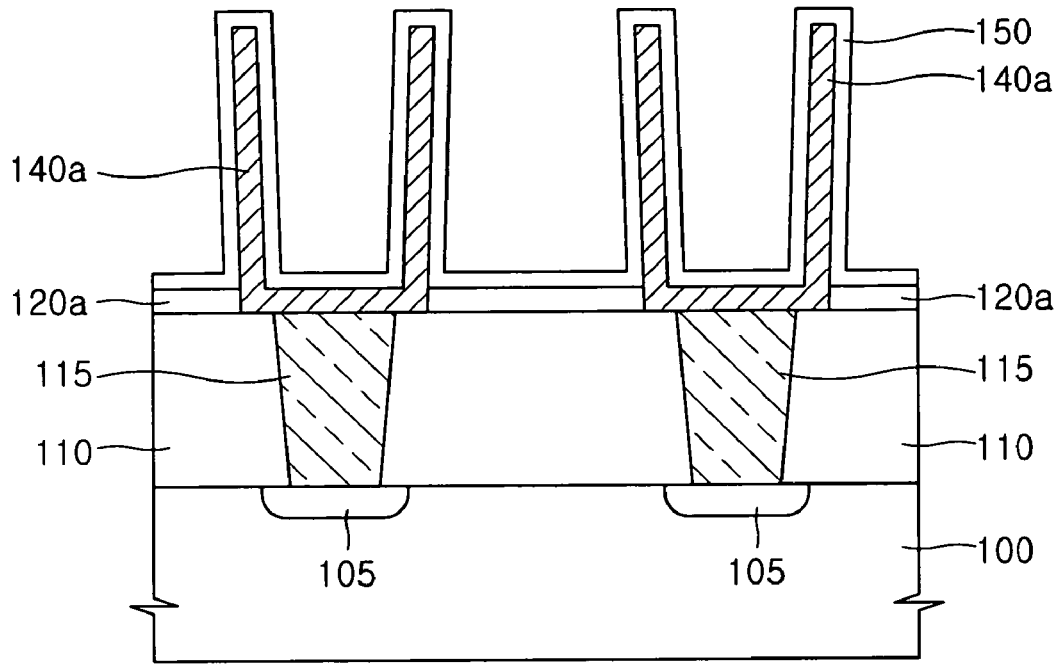

Next, the capping layer 145 and the mold oxide layer pattern 130a may be removed in their entirety using, for example, a wet-etching to expose the surface of the lower electrode 140a. Then, as shown in FIG. 5, a dielectric layer 150 is formed on the exposed surfaces of the lower electrode 140a and the etch-stop layer pattern 120a. Before the dielectric layer 150 is formed, a plasma nitridation or a thermal nitridation treatment using, for example, $NH_3$ can be performed on the exposed surfaces of the lower electrode 140a. By doing so, a silicon nitride layer with a thickness of 10-20 Å can be formed on the surface of the lower electrode 140a which may help reduce and/or minimize reaction between the lower electrode 140a and the dielectric layer 150.

The dielectric layer 150 can, for example, be formed of a material selected from the group consisting of a $HfO_2$ layer, an $Al_2O_3$ layer, a $ZrO_2$ layer, a $TiO_2$ layer, a $SrTiO_3$ layer and/or a combination thereof. The dielectric layer 150 can be formed using a CVD or an ALD process. When an ALD deposition technique is used, the deposition can be performed at a relatively low temperature (e.g., at as low as about 300° C.), which may be advantageous in viewpoint of process temperature. In addition, the dielectric layer 150 may be $O_3$-processed, plasma-processed, or thermally processed under gas atmosphere that includes oxygen or nitrogen after deposition to improve the electrical characteristic of the dielectric layer 150.

Figure 6:
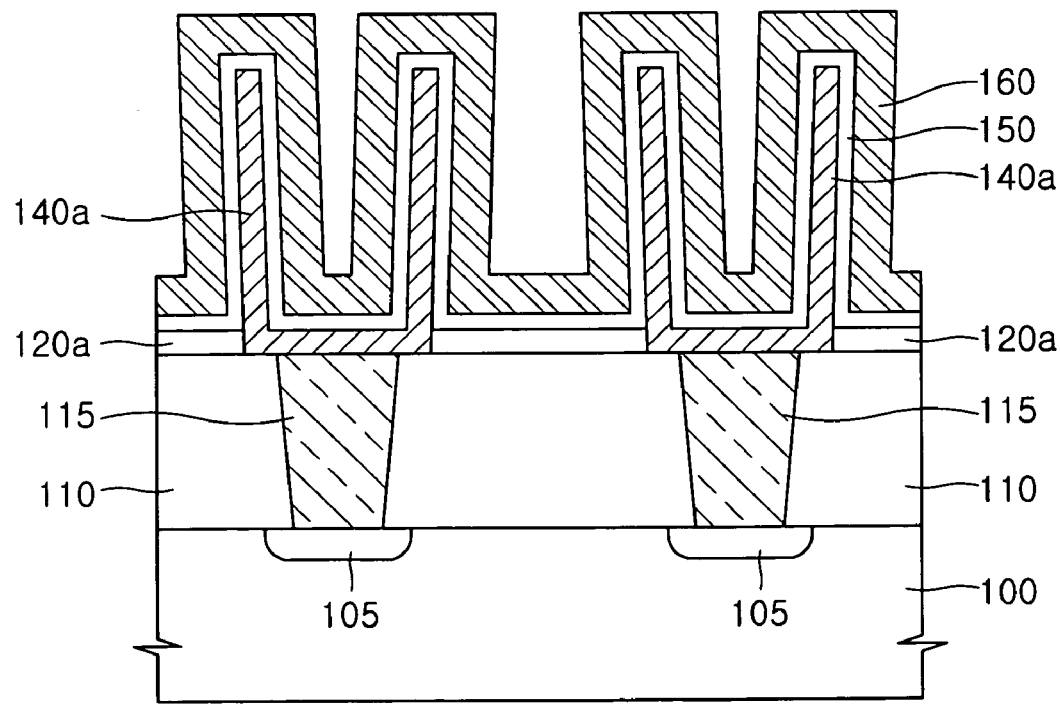

Next, referring to FIG. 6, a conductive metal nitride layer 160 is formed on the dielectric layer 150. The conductive metal nitride layer 160 can be formed of one material selected from the group consisting of TiN, WN, TaN and/or a combination thereof. The conductive metal nitride layer 160 can be formed using, for example, a CVD, an ALD or an MOCVD process.

As shown in FIG. 7, at least part of the conductive metal nitride layer 160 is oxidized (162) to form a conductive metal oxide nitride layer 164. The oxidation (162) can be performed using, for example, a rapid thermal oxidation (RTO) process or a plasma oxidation. In the example of FIG. 7, only part of the conductive metal nitride layer 160 is oxidized.

In the exemplary embodiment of FIGS. 1-8, the conductive metal nitride layer 160 is formed of TiN. At least part of the TiN is oxidized to form TiON as the conductive metal oxide nitride layer 164. During this oxidation process, $N_2$ may be trapped in a plurality of interstitial sites within the TiON and/or nitrogen may form N—O bonds in the TiON. As a result, doping sites in the oxidized portion 164 of the conductive metal nitride layer 160 may be filled with nitrogen, so that penetration of a dopant (for example, boron) from a subsequent process (e.g., doping of an upper electrode material) can be reduced and/or minimized.

The operation (162) of oxidizing at least part of the conductive metal nitride layer 160 to fill doping sites in the conductive metal nitride layer 160 with nitrogen may, as noted above, be performed by plasma oxidation. The plasma oxidation may be performed, for example, using Ar or $N_2$ as an inert gas and $O_2$, $O_3$, or $N_2O$ as a reactive gas. The plasma oxidation may be performed, for example, at a temperature in the range from room temperature to about 350° C., at an RF power in a range between about 0-1000 W, at a pressure in a range between about 1-200 Pa, and for a time in a range of about 0-180 seconds. In specific embodiments, the plasma oxidation may be performed at an RF power of about 100-500 W and at a pressure of about 2-200 Pa for about 30-180 seconds, using, for example, $N_2$ as an inert gas with flux of about 0-0.5 standard liters per minute (slm) and using $O_2$ as a reactive gas with flux of about 0.5-1 slm. The above conditions are oxidation conditions that may be used to form a silicon oxidation layer having a thickness of about 15-25 Å on a bare silicon substrate.

Next, a doped polysilicon germanium layer 170 is formed on the conductive metal oxide nitride layer 164 so as to form an upper electrode 180 consisting of the conductive metal nitride layer 160, the conductive metal oxide nitride layer 164, and the doped polysilicon germanium layer 170 as illustrated in FIG. 8.

The doped polysilicon germanium 170 may be formed as an n-type layer or as a p-type by deposition and doping a dopant in-situ using conventional equipment. Of course, instead of an in-situ type method, a two-step operation of depositing a polysilicon germanium layer and then doping the same with a dopant can be also used.

The silicon germanium layer may be formed using, for example, a silane series gas (e.g., $SiH_4$, $Si_2H_6$, and $SiH_2Cl_2$) and $GeH_4$ and $GeF_4$ for a source gas at temperature below 500° C. (e.g., about 400-500° C.), preferably at about 430° C. The silicon germanium layer can be formed in an amorphous state initially and then polycrystallized when activation of the dopants by a thermal treatment is performed, or can alternatively be formed in a polycrystallized state. In the case where the silicon germanium layer is formed in an amorphous state, the deposition temperature can be lowered below 400° C. (e.g., even to the range of about 350-400° C.) and the subsequent activation thermal treatment temperature can be lowered below 500° C. (e.g., in the range of about 400-500° C.).

An n-type doped polysilicon germanium layer may be formed by doping P or As in-situ during deposition of the polysilicon germanium layer. A p-type doped polysilicon germanium layer may be formed by doping B while the polysilicon germanium layer is deposited. $BCl_3$ or $B_2H_6$ can be used, for example as the B-doping source. Since the doping of the silicon germanium layer with the dopant may be used to secure a specific resistance, the doping concentration may be determined with consideration of a desired specific resistance range.

As described above, the present invention uses a stacked layer including the conductive metal nitride layer 160 and the doped polysilicon germanium layer 170 as the upper electrode 180. Also, at least part of the conductive metal nitride layer 160 is oxidized to form the conductive metal oxide nitride layer 164 such that doping sites may be filled with nitrogen in advance to reduce and/or minimize penetration of the dopant (for example, boron) of the doped polysilicon germanium layer 170 into the lower layer can be reduced and/or minimized.

Figure 9:
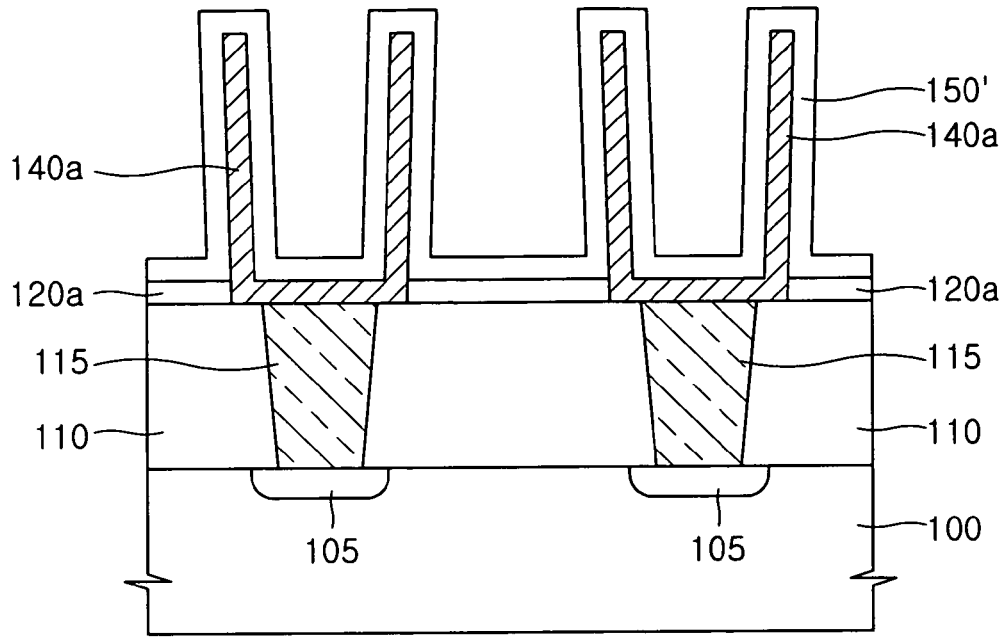
FIGS. 9 through 11 are cross-sectional diagrams illustrating semiconductor capacitors and methods of fabricating such capacitors according to second embodiments of the present invention.
Figure 10:
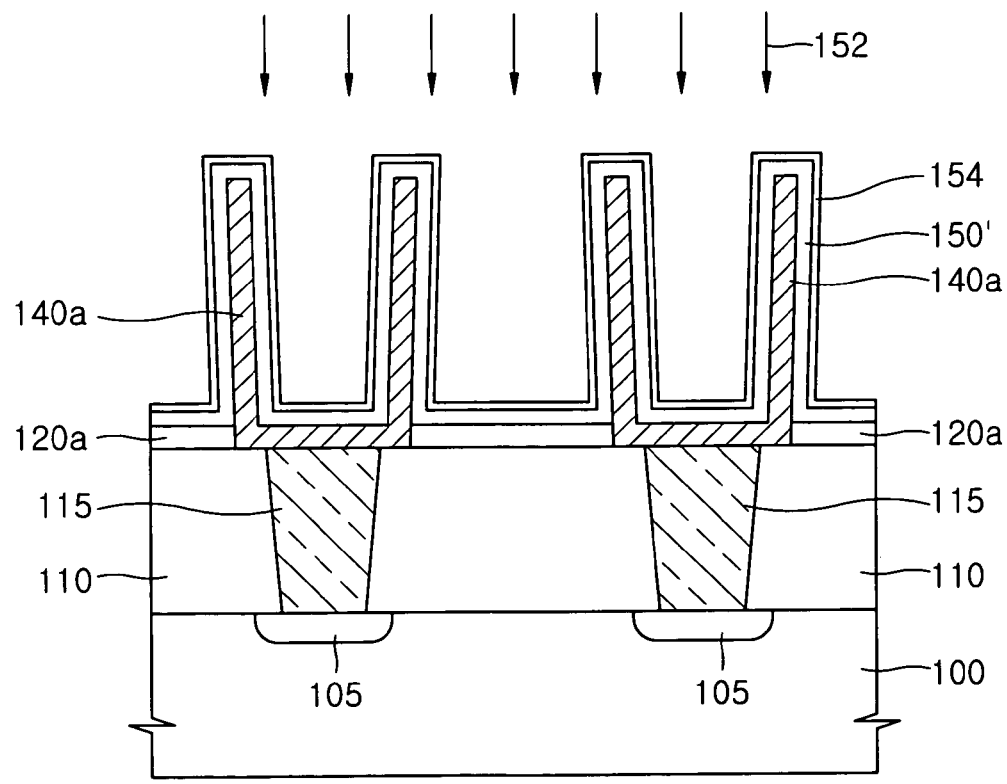
Figure 11:
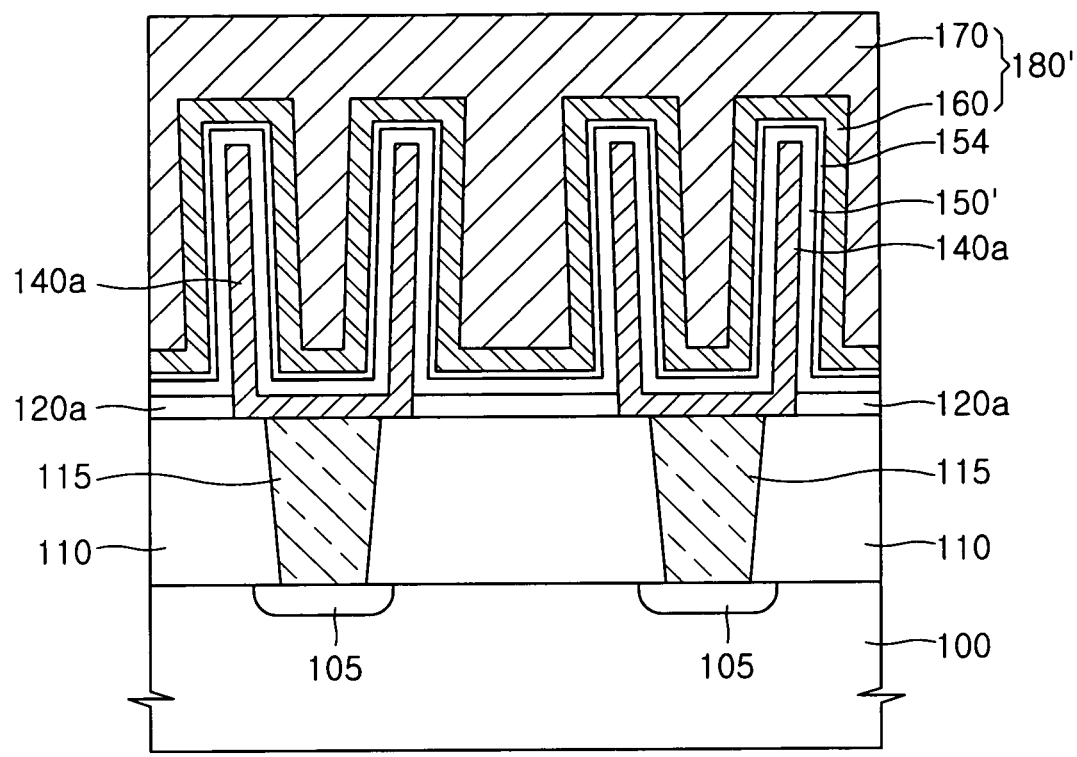

FIGS. 9 through 11 are cross-sectional diagrams illustrating capacitors and methods of fabricating such capacitors according to second embodiments of the present invention. In FIGS. 9 through 11, the same reference numerals are given to the same elements as those in the first embodiments and description thereof will accordingly be omitted.

As shown in FIG. 11, the capacitor includes a capacitor lower electrode 140a formed on a semiconductor substrate 100, an oxide dielectric layer 150' formed on the lower electrode 140a, an oxide nitride dielectric layer 154 formed by nitridizing at least part of the oxide dielectric layer 150', and an upper electrode 180' formed thereon. The upper electrode 180' includes a conductive metal nitride layer 160 and a doped polysilicon germanium layer 170.

The oxide dielectric layer 150' may be formed of $HfO_2$, and the oxide nitride dielectric layer 154 may be formed by nitridizing at least part of the upper surface of the dielectric layer 150'. $N_2$ is trapped in a plurality of interstitial sites within the HfON layer, or nitrogen may form N—O bonds in the HfON. The oxide nitride dielectric layer 154 can reduce and/or prevent a dopant (for example, boron) of the doped polysilicon germanium layer 170 from penetrating into a lower layer. This may help address problems of a leakage current increase and deterioration in a data retention and a refresh characteristic due to penetration of the dopant such as boron.

Next, a method of fabricating the above-described capacitors will be described.

First, the operations described with reference to FIGS. 1 through 5 may be performed to form a capacitor lower electrode 140a on a semiconductor substrate 100 as illustrated in FIG. 9. The dielectric layer 150' is formed on the lower electrode 140a. The dielectric layer 150' is an oxide dielectric layer and may, for example, be one selected from the group consisting of a $HfO_2$ layer, an $Al_2O_3$ layer, a $ZrO_2$ layer, a $TiO_2$ layer, a $SrTiO_3$ layer and/or a combination thereof.

Next, as shown in FIG. 10, at least part of the dielectric layer 150' is nitridized (152) to form an oxide nitride dielectric layer 154. The nitridation (152) may be performed using, for example, a plasma nitridation.

The dielectric layer 150' may be formed of $HfO_2$, and at least part of the upper surface of the dielectric layer 150' is nitridized (subject to nitridation) to form HfON as the oxide nitride dielectric layer 154. At this point, $N_2$ is trapped in a plurality of interstitial sites within the HfON, and/or nitrogen forms N—O bonds in the HfON. As such, doping sites in the conductive metal nitride layer 150' may be filled with nitrogen, so that penetration of a dopant (for example, boron) implanted or grown subsequently in the upper electrode material can be reduced, minimized and/or prevented.

The plasma nitridation (152) can be performed using, for example, a mixture of $N_2$, $NH_3$, $N_2$ and $NH_3$, or a mixture of $H_2$ and these gases. The plasma nitridation may be performed at a temperature in a range, for example, from about room temperature to 500° C., at an RF power of, for example, about 0-1000 W, at a pressure of, for example, about 1-200 Pa, for about 0-180 seconds. In specific embodiments, the plasma nitridation may be performed at an RF power of about 200-1000 W and at a pressure of about 2-200 Pa for about 60-180 seconds, and the plasma nitridation may be performed using $N_2$ with flux of about 0.5-1 slm, $HN_3$ with flux of about 0-0.5 slm, and $H_2$ with flux about of 0-0.5 slm.

The conductive metal nitride layer 160 and the doped polysilicon germanium layer 170 are sequentially stacked on the oxide nitride dielectric layer 154 to form an upper electrode 180' as illustrated in FIG. 11.

In the above-described fabrication method, at least part of the oxide dielectric layer 150' is nitridized to form the oxide nitride dielectric layer 154 such that doping sites may be filled with nitrogen in advance. Therefore, penetration of the dopant (for example, boron) of the doped polysilicon germanium layer 170 into the lower layer can be reduced, minimized and/or prevented.

EXPERIMENT 1

First and second semiconductor capacitors were formed according to the first embodiments of the present invention described above. In the first semiconductor capacitor, TiN was used to form the conductive metal nitride layer of the capacitor upper electrode and an RTO (rapid thermal oxidation) was performed on the surface of the TiN. In the second semiconductor capacitor, TiN was again used to form the conductive metal nitride layer, and a plasma oxidation was performed on the surface of the TiN. The chemical bonding state of the nitrogen in the TiON layer that was formed by oxidizing the TiN was then examined using an XPS (x-ray photoelectron spectroscopy).

Figure 12:
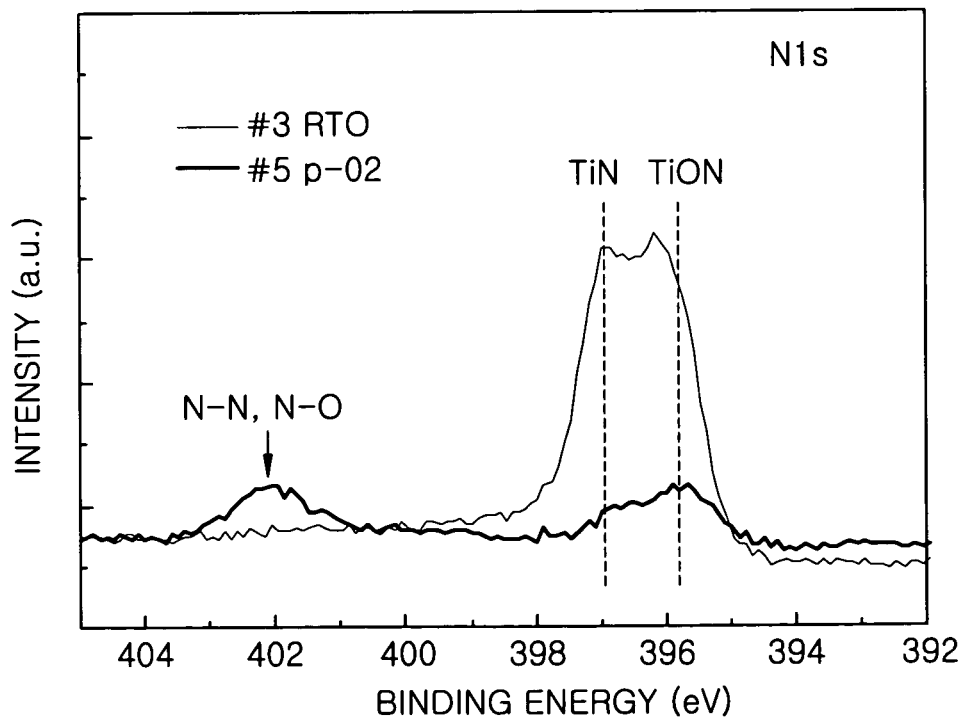
FIG. 12 is a graph illustrating the intensity of the binding energy of nitrogen within the TiON as measured by an X-ray photoemission spectroscopy (XPS)

FIG. 12 is a graph illustrating the intensity of binding energy of nitrogen (measured in arbitrary units) formed within the TiON as measured by an XPS.

As shown in FIG. 12, in the case where the RTO is performed (thin solid line in FIG. 12), the nitrogen exists mainly in N—Ti—N bonds and/or O—Ti—N bonds, as illustrated by the broad peak in the graph at the TiN and TiON locations. In contrast, in the case where the plasma oxidation is performed (thick solid line FIG. 12), the nitrogen not only forms the N—Ti—N bonds and/or O—Ti—N bonds, but also exists in interstitial sites within TiON in the form of an O—Ti—O or an O—Ti—N, or forms N—O bonds, thereby occupying a doping site.

That is, when the TiN is rapidly oxidized by the plasma oxidation, nitrogen atoms replaced by oxygen form $N_2$ to be trapped in the interstitial site or form a weak N—O bond with oxygen. Thus, Experiment 1 shows that the doping site in the TiON tends to fill with nitrogen in the plasma oxidation process. Therefore, though the RTO can be performed, the oxidizing of the TiN using the plasma oxidation can more effectively reduce and/or prevent the penetration of a dopant such as boron.

Process conditions of the plasma oxidation adopted herein are shown in the following Table 1.

TABLE 1

| Gas flux (slm) | | Process pressure (Pa) | RF power (W) | Process temperature (° C.) | Process time (second) |
|---|---|---|---|---|---|
| $N_2$ | $O_2$ | 2-200 | 100-500 | Room temperature-350 | 0-180 |
| 0-0.5 | 0.5-1 | | | | |

EXPERIMENT 2

In the second embodiment, a semiconductor capacitor was formed according to the second embodiments of the present invention. The capacitor included an $HfO_2$ oxide dielectric layer, and a plasma nitridation was performed on the $HfO_2$ oxide dielectric layer. The chemical bonding state of nitrogen in the HfON layer that was formed by nitridizing the $HfO_2$ layer was examined using an XPS and an XAS.

Figure 13:
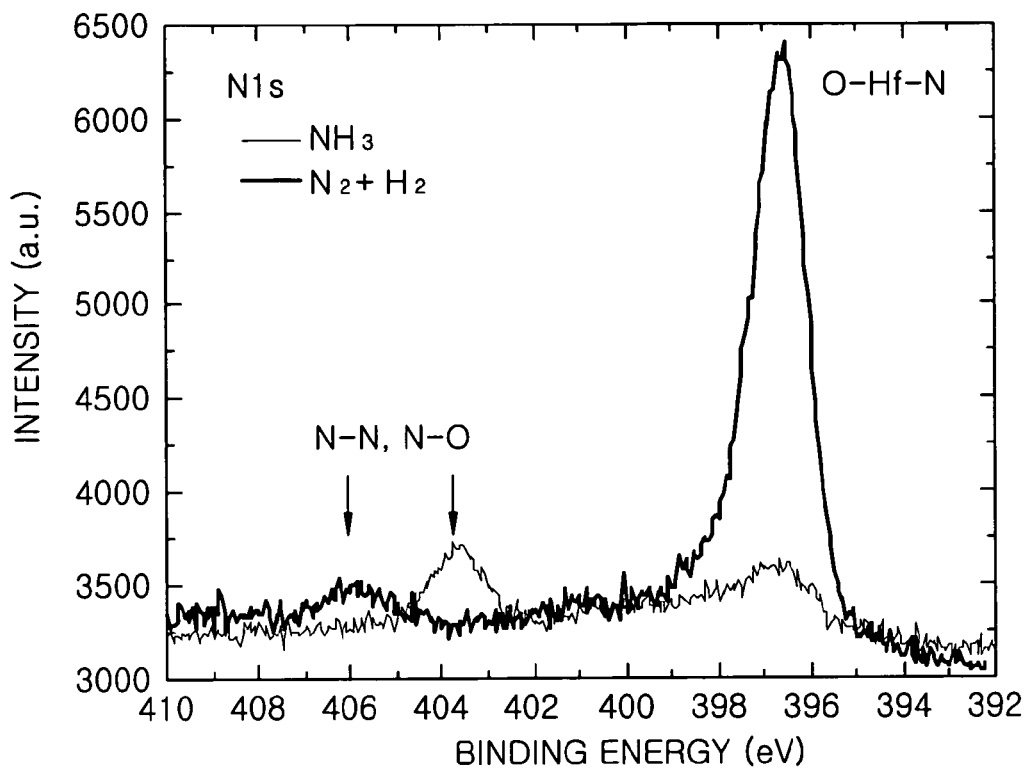
FIGS. 13 and 14 are graphs illustrating the intensity of the binding energy of nitrogen within the HfON as measured by an XPS and an X-ray absorption spectroscopy (XAS), respectively.
Figure 14:
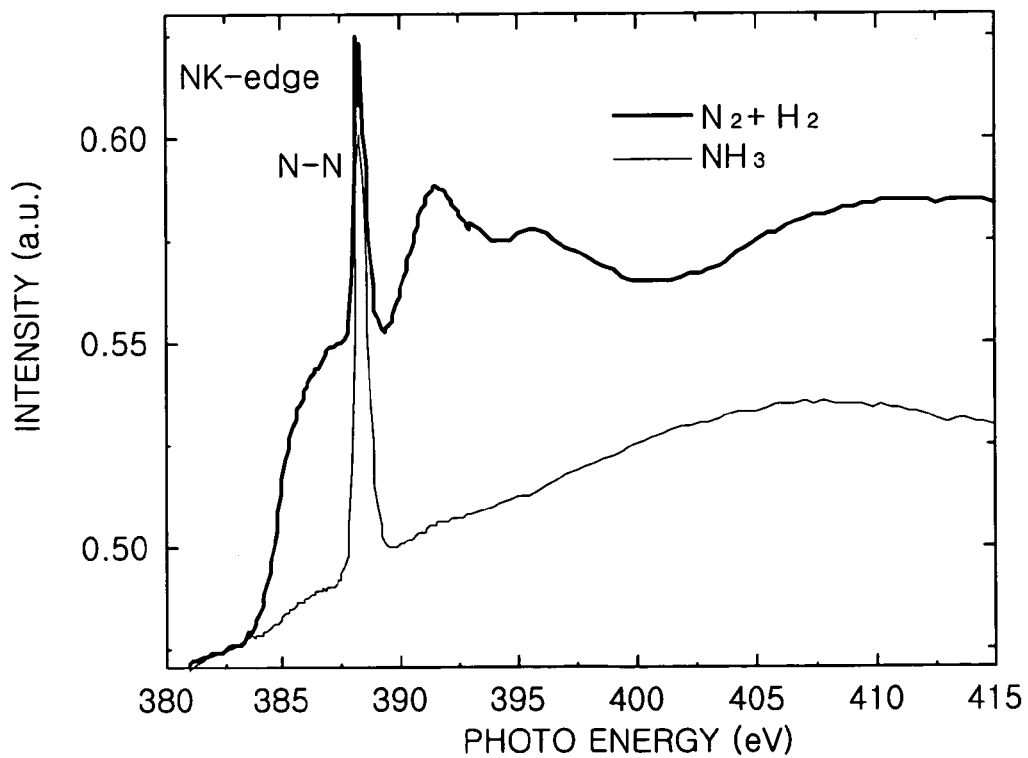

FIGS. 13 and 14 are graphs illustrating the intensity of the binding energy of the nitrogen within the HfON layer as measured by the XPS and the XAS (x-ray absorption spectroscopy), respectively.

As shown in FIGS. 13 and 14, in the case where the plasma nitridation is performed using $NH_3$ (thin solid line in the graphs) or a combination of $N_2$ and $H_2$ (thick solid line in the graphs), nitrogen exists in interstitial sites of the Hf—O bonds or forms N—O bonds to occupy a doping site. The graph shows that it is possible to prevent penetration of a dopant such as boron by nitridizing the $HfO_2$ using the plasma nitridation and filling the doping site with nitrogen in advance.

Process conditions of the plasma nitridation adopted herein are shown in the following Table 2.

TABLE 2

| Gas flux (slm) | | | Process pressure (Pa) | RF power (W) | Process temperature (° C.) | Process time (second) |
|---|---|---|---|---|---|---|
| $N_2$ | $NH_3$ | $H_2$ | 2-200 | 200-1000 | Room temperature-500 | 60-180 |
| 0.5-1 | 0-0.5 | 0-0.5 | | | | |

According to embodiments of the present invention, in the capacitor having the upper electrode where the conductive metal nitride layer and the doped polysilicon germanium layer are stacked, at least part of the conductive metal nitride layer is oxidized or at least part of the capacitor dielectric layer is nitridized. By doing so, nitrogen can be trapped in interstitial sites or form N—O bonds, so that the doping site can be filled with the nitrogen in advance. As a result, diffusion of a dopant from the doped polysilicon germanium layer of the upper electrode may be reduced, which may reduce the leakage current of the capacitor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a capacitor included in a semiconductor device, the method comprising:
   forming a capacitor lower electrode on a semiconductor substrate;
   forming a dielectric layer on the capacitor lower electrode;
   forming a conductive metal nitride layer on the dielectric layer;
   forming a conductive metal-nitride-oxide layer on the conductive metal nitride layer; and
   forming a doped polysilicon germanium layer on the conductive metal-oxide-nitride layer.

2. The method of claim 1, wherein forming a conductive metal-nitride-oxide layer on the conductive metal nitride layer comprises oxidizing at least part of the conductive metal nitride layer.

3. The method of claim 1, wherein the doped polysilicon germanium layer is doped with boron.

4. The method of claim 1, wherein the conductive metal nitride layer comprises TiN, WN and/or TaN.

5. The method of claim 2, wherein the conductive metal nitride layer comprises TiN, wherein at least part of the conductive metal nitride layer is oxidized to form TiON, and wherein $N_2$ is trapped in a plurality of interstitial sites within the TiON.

6. The method of claim 2, wherein the conductive metal nitride layer comprises TiN, wherein at least part of the conductive metal nitride layer is oxidized to form TiON, and wherein nitrogen forms a plurality of N—O bonds in the TiON.

7. The method of claim 2, wherein oxidizing at least part of the conductive metal nitride layer is performed by a plasma oxidation.

8. The method of claim 7, wherein the plasma oxidation is performed at a temperature in a range from about room temperature to about 350° C., at an RF power in a range between about 0-1000 W, at a pressure in a range of about 1-200 Pa, for a time in a range of about 0-180 seconds.

9. A method of fabricating a capacitor of a semiconductor device, the method comprising:

forming a capacitor lower electrode on a semiconductor substrate;

forming an oxide dielectric layer on the capacitor lower electrode;

forming an oxide-nitride dielectric layer on the oxide dielectric layer; and forming a capacitor upper electrode that includes a conductive metal nitride layer and a doped polysilicon germanium layer on the oxide-nitride dielectric layer.

10. The method of claim 9, wherein forming an oxide-nitride dielectric layer on the oxide dielectric layer comprises nitridizing at least part of the oxide dielectric layer.

11. The method of claim 9, wherein the oxide dielectric layer comprises a $HfO_2$ layer, an $Al_2O_3$ layer, a $ZrO_2$ layer, a $Ta_2O_5$ layer a $TiO_2$ layer, a $SrTiO_3$ layer and/or a $(Ba, Sr)TiO_3$ layer.

12. The method of claim 9, wherein the doped polysilicon germanium layer is doped with boron.

13. The method of claim 9, wherein the conductive metal nitride layer comprises TiN, WN and/or TaN.

14. The method of claim 10, wherein the oxide dielectric layer comprises a $HfO_2$ layer, wherein the oxide-nitride dielectric layer comprises a HfON layer, and wherein $N_2$ is trapped in a plurality of interstitial sites within the HfON layer.

15. The method of claim 10, wherein the oxide dielectric layer is a $HfO_2$ layer, wherein the oxide-nitride dielectric layer comprises HfON, and wherein nitrogen forms a plurality of N—O bonds in the HfON.

16. The method of claim 9, wherein forming the oxide-nitride dielectric layer on the oxide dielectric layer comprises nitridizing at least part of the oxide dielectric layer using a plasma nitridation.

17. The method of claim 15, wherein the plasma nitridation is performed at a temperature in a range from about room temperature to about 500° C., at an RF power in a range between about 0-1000 W, at a pressure in a range between about 1-200 Pa, and for a time in a range of about 0-180 seconds.

18. A method of fabricating a capacitor, the method comprising:

forming a lower electrode on a semiconductor substrate;

forming a dielectric layer on the lower electrode;

forming an oxide nitride layer on the dielectric layer; and forming an upper electrode that comprises a doped semiconductor layer on the dielectric layer and on the oxide nitride layer;

wherein the dielectric layer and the oxide nitride layer are both between the lower electrode and the upper electrode.

19. A method of fabricating a capacitor, the method comprising:

forming a lower electrode on a semiconductor substrate;

forming a dielectric layer on the lower electrode;

forming an oxide nitride layer on the dielectric layer; and forming an upper electrode that comprises a doped semiconductor layer on the dielectric layer and on the oxide nitride layer;

wherein the doped semiconductor layer comprises a polysilicon germanium layer.

20. The method of claim 19, wherein the upper electrode further comprises a conductive metal nitride layer, and wherein forming the oxide nitride layer on the dielectric layer comprises oxidizing at least an upper surface of the conductive metal nitride layer.

21. The method of claim 19, wherein the dielectric layer comprises an oxide dielectric layer, wherein forming the oxide nitride layer comprises nitridizing at least an upper surface of the oxide dielectric layer, and wherein the upper electrode further comprises a conductive metal nitride layer between the oxide nitride layer and the doped polysilicon germanium layer.

* * * * *